(12) United States Patent
Dale et al.

(10) Patent No.: US 8,704,529 B2
(45) Date of Patent: Apr. 22, 2014

(54) CIRCUIT TEST INTERFACE AND TEST METHOD THEREOF

(75) Inventors: Bret Dale, Jericho, VT (US); Oliver Kiehl, Charlotte, VT (US)

(73) Assignee: Nanya Technology Corporation, Taoyuan (TW)

( * ) Notice: Subject to any disclaimer, the term of this patent is extended or adjusted under 35 U.S.C. 154(b) by 288 days.

(21) Appl. No.: 13/253,061

(22) Filed: Oct. 4, 2011

(65) Prior Publication Data

US 2013/0082718 A1    Apr. 4, 2013

(51) Int. Cl.
*G01R 1/00* (2006.01)
(52) U.S. Cl.
USPC ....... 324/555; 324/500; 324/762.03; 714/733
(58) Field of Classification Search
USPC ............ 324/500, 555, 750.3, 762.01–762.03, 324/762.09; 438/14–18; 326/16; 714/727, 714/733–734
See application file for complete search history.

(56) References Cited

U.S. PATENT DOCUMENTS 5,371,457 A * 12/1994 Lipp .................. 324/762.02
7,743,297 B2 * 6/2010 Uchida .................. 714/726
8,368,422 B1 * 2/2013 Dale et al. ............... 326/16

FOREIGN PATENT DOCUMENTS

TW    200411199    7/2004
TW    201030358    8/2010

OTHER PUBLICATIONS

"Office Action of Taiwan Counterpart Application", issued on Dec. 3, 2013, pp. 1-3.

* cited by examiner

*Primary Examiner* — Arleen M Vazquez
*Assistant Examiner* — Robert P Alejnikov, Jr.
(74) *Attorney, Agent, or Firm* — Jianq Chyun IP Office

(57) ABSTRACT

A circuit test interface and a test method are disclosed. The circuit test interface may include a test voltage input pad, a test voltage output pad, and a plurality of input buffers. Each of the plurality of input buffers may have a first input terminal, a second input terminal, and an output terminal. The first input terminal of each respective input buffer may be coupled to one of a plurality of through-silicon vias (TSVs). The circuit test interface may further include a plurality of switch units. Each of the plurality of switch units may have a first terminal and a second terminal. The circuit test interface may further include a scan chain, coupled to both the output terminal of each of the plurality of input buffers and to the test voltage output pad.

12 Claims, 4 Drawing Sheets

CIRCUIT TEST INTERFACE AND TEST METHOD THEREOF

BACKGROUND

1. Field of the Invention

The present application generally relates to a circuit test interface, and more particularly, to a test interface of an input buffer.

2. Description of Related Art

FIG. 1 illustrates a circuit diagram of a conventional off-chip driver (OCD) and an input buffer. Referring to FIG. 1, the output terminal of the OCD 110 is coupled to a through-silicon via (TSV) 130. An input terminal of the input buffer 120 is coupled to the TSV 130 and an output terminal of the OCD 110.

Conventionally, when the OCD 110 and/or the input buffer 120 are tested, the TSV 130 is directly contacted by a test probe on a probe card, and electrical test signals are transmitted or received through the TSV 130.

In operation, the OCD 110 is attached to other electrical components through the TSV 130 which is traditionally the only 110 port to the circuit in FIG. 1. The TSV 130 has a relatively low maximum pin capacitance specification. Since the surface area of a TSV 130 is relatively small, conventional test probes may not be able to reliably probe. In one conventional embodiment, a conventional test pad might be attached to the TSV 130 with an on die metal trace. This embodiment would traditionally not be used in functional mode but only in a test mode, because, among other things, the test probe pad has a relatively large parasitic capacitance associated with it. Therefore, the conventional TSV 130 probing test method would tend to cause the TSV 130 to have an observed capacitance that is much greater than the relatively low maximum pin capacitance specification.

SUMMARY

Accordingly, the present application is directed to a circuit test interface in which the cost for testing a circuit is effectively reduced.

The present application is directed to a test method of a circuit in which the cost for testing the circuit is effectively reduced.

In one embodiment, a circuit test interface comprises a test voltage input pad, a test voltage output pad, and a plurality of input buffers. Each of the plurality of input buffers has a first input terminal, a second input terminal, and an output terminal. The first input terminal of each respective input buffer is coupled to one of a plurality of through-silicon vias (TSVs). The circuit test interface further comprises a plurality of switch units. Each of the plurality of switch units has a first terminal and a second terminal. The first terminal of each of the switch units is coupled to the first input terminal of one of the plurality of input buffers and the corresponding TSV, and the second terminal of each of the switch units is coupled to the test voltage input pad. The circuit test interface further comprises a scan chain, coupled to both the output terminal of each of the plurality of input buffers and to the test voltage output pad.

In another embodiment, a test method of a circuit is disclosed. The circuit comprises a plurality of input buffers, each of the plurality of input buffers having a first input terminal, a second input terminal, and an output terminal, the first input terminal of each of the plurality of the input buffers is coupled to one of a plurality of TSVs. The test method comprises creating, using a plurality of switch units, an electrical connection between a test voltage input pad and at least one of the plurality of input buffers, and transmitting a test voltage from the test voltage input pad via the plurality of switch units to the plurality of input buffers. The test method further comprises receiving an output voltage from each output terminal of the plurality of input buffers into a scan chain; and transmitting sequentially the output voltages received by the scan chain to a test voltage output pad.

As described above, in some embodiments, a plurality of switch units is provided to connect TSVs on a circuit to a test voltage input pad. When a test is performed, a test voltage is supplied through the test voltage input pad and transmitted to a plurality of input buffers by turning on the switch units. Additionally, in some embodiments, a scan chain is provided to sequentially transmit output voltages generated by the input buffers according to the test voltage to a test voltage output pad, such that a test operator can determine whether the input buffers are working properly according to the output voltages on the test voltage output pad. Thus, the test probes are coupled to the TSVs through the test voltage output pad and test voltage input pad to supply or receive any voltage in test mode. In functional mode, the test voltage input pad is cut off from the TSV, and the input buffer and the off-chip driver can be operated normally.

In the following detailed description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that various changes may be made without departing from the spirit and scope of the present invention. The following detailed description is, therefore, not to be taken in a limiting sense.

DETAILED DESCRIPTION

Figure 1:
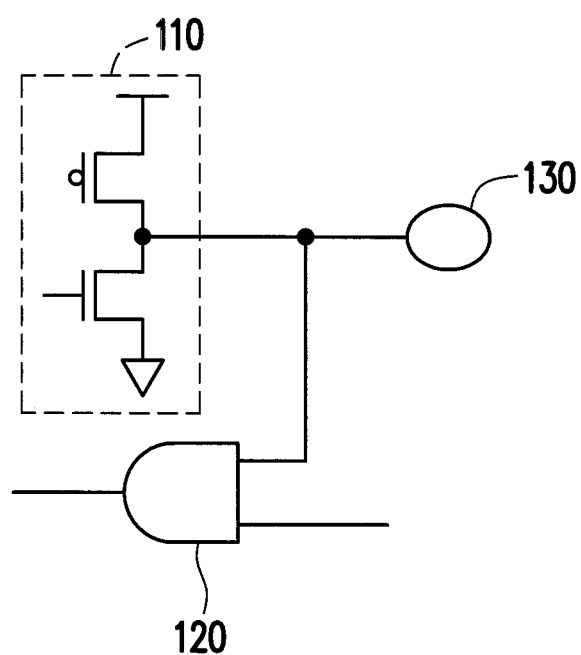
FIG. 1 is a circuit diagram of a conventional off-chip driver (OCD) and an input buffer.

Reference will now be made in detail to the present preferred embodiments of the invention, examples of which are illustrated in the accompanying drawings. Wherever possible, the same reference numbers are used in the drawings and the description to refer to the same or like parts.

Figure 2:
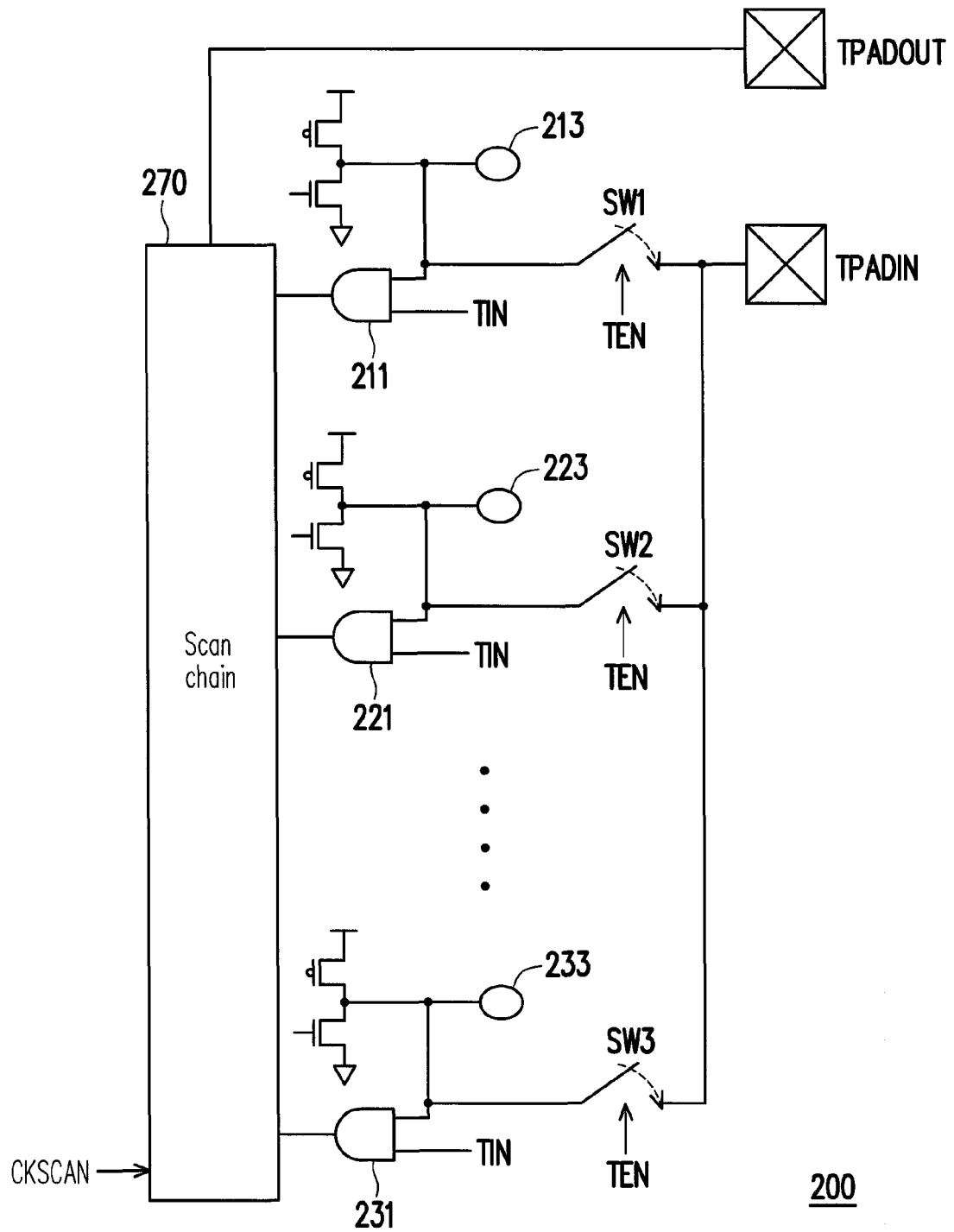
FIG. 2 is a diagram of a circuit test interface 200 according to an embodiment of the present application.

FIG. 2 is a diagram of a circuit test interface 200 according to an embodiment of the present application. Referring to FIG. 2, the circuit test interface 200 includes a test voltage input pad TPADIN, a test voltage output pad TPADOUT, input buffers 211-231, switch units SW1-SW3, through-silicon vias (TSVs) 213-233, and a scan chain 270. According the one embodiment, the circuit test interface 200 may be part of a chip. In the illustrated embodiment, each of the input buffers 211-231 has two input terminals and one output terminal. A first input terminals of each respective input buffers 211-231 is coupled to one of the TSVs 213-233. A terminal of each of the switch units SW1-SW3 is coupled to the first input terminal of each of the input buffers 211-231, and the terminals of the switch units SW1-SW3 that are not coupled to the corresponding input buffers 211-231 are all coupled to the test voltage input pad TPADIN.

Additionally, the scan chain 270 is coupled to the test voltage output pad TPADOUT at one end and to the output terminals of the input buffers 211-231 at the other end. In the illustrated embodiment, the scan chain 270 receives a clock signal CKSCAN.

In operation, to test the input buffers 211-231, a testing machine may be coupled to the test voltage input pad TPADIN and the test voltage output pad TPADOUT by using a test probe on a probe card. The switch units SW1-SW3 may be turned on, to electrically connect TPADIN to a first input terminal of each respective input buffer 211-231. In an embodiment, the testing machine may supply a test voltage to the test voltage input pad TPADIN, and the test voltage may be transmitted to each respective first input terminal of the input buffers 211-231 through the switch units SW1-SW3.

In operation, upon reception of a test voltage, each of the input buffers 211-231 may generate an output voltage related to the test voltage and a voltage received at the TIN input of each respective input buffer 211-230. According to an embodiment where the input buffers 211-231 are AND gates, the output voltages generated by the input buffers 211-231 should be approximately identical to the test voltage. In some embodiments, the input voltage received at the TIN input of each respective input buffer 211-231 may be at a logic high level.

In one embodiment, the scan chain 270 receives a plurality of output voltages from the input buffers 211-231 and may sequentially transmit the plurality of output voltages to the test voltage output pad TPADOUT according to the clock signal CKSCAN. According to an embodiment, the testing machine can read the output voltages generated by the input buffers 211-231 through the test voltage output pad TPADOUT. According to some embodiments, the testing machine can determine whether any error occurs in the input buffers 211-231 by simply determining whether the logic levels of the output voltages generated by the input buffers 211-231 are equal to the logic level of the test voltage.

According to an embodiment, the on and off state of the switch units SW1-SW3 can be determined via a test enabling signal TEN. In an embodiment, when the input buffers 211-231 are tested, the test enabling signal TEN may be enabled (for example, at a logic high level), and the switch units SW1-SW3 may be turned on according to the enabled test enabling signal TEN. After completing the testing of the input buffers 211-231, the test enabling signal TEN may be disabled (for example, at a logic low level), and the switch units SW1-SW3 may be turned off according to the disabled test enabling signal TEN. The test enabling signal TEN may be generated by a circuit inside the chip containing the circuit test interface 200 according to a command signal issued by the testing machine, or it may be driven into the circuit test interface 200. The mechanism employed by the testing machine for activating the test mode of the chip through the command signal and disabling/enabling of the test enabling signal TEN is well known to those having ordinary knowledge in the art therefore will not be described herein.

In a functional mode, the test enabling signal TEN may be disabled, and the connection between the test voltage output pad TPADOUT and the TSVs 213-233 may thereby be cut off to enable the circuit to operate normally.

Figure 3:
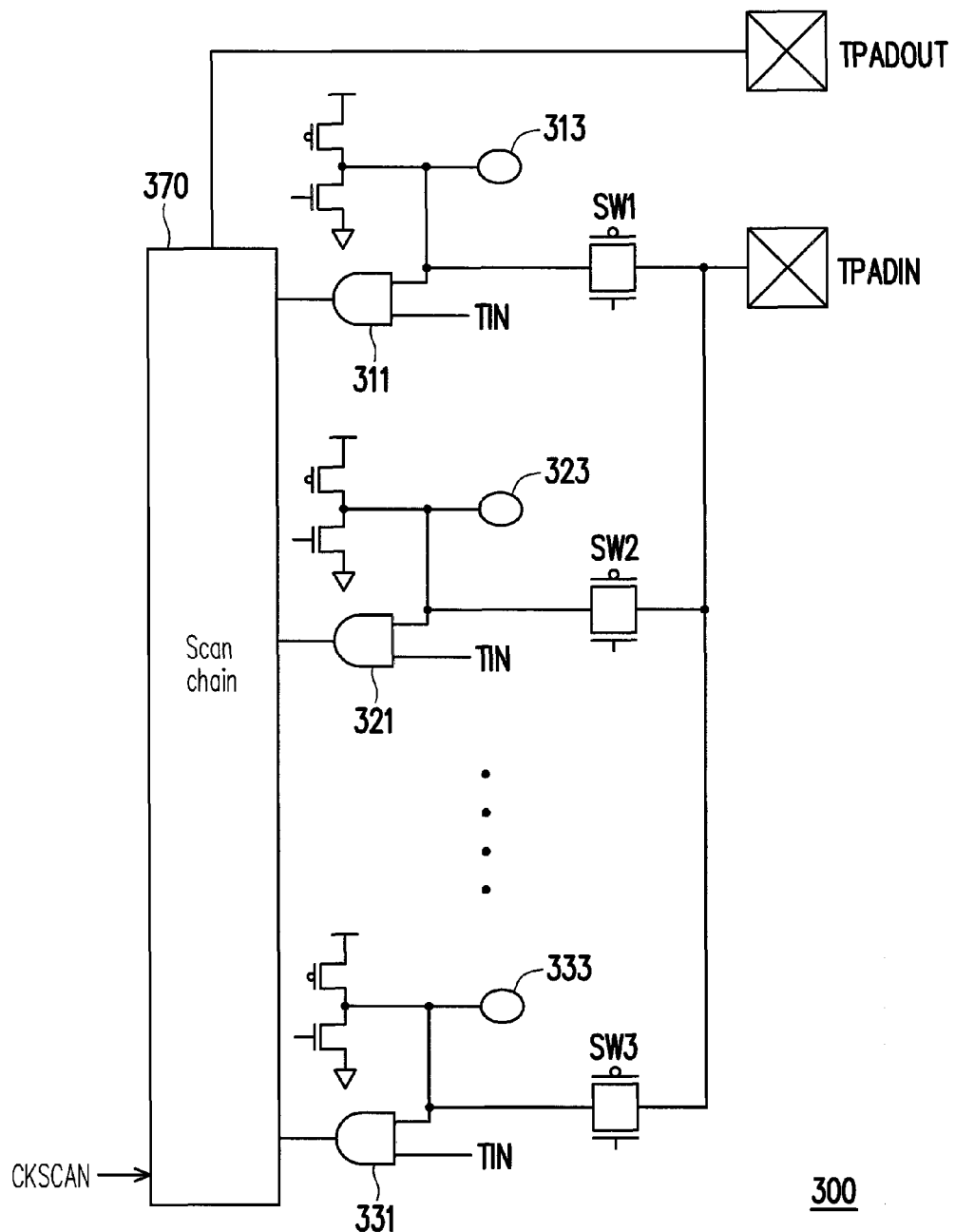
FIG. 3 is a diagram of a circuit test interface 300 according to another embodiment of the present application.

FIG. 3 is a diagram of a circuit test interface 300 according to another embodiment of the invention. Referring to FIG. 3, the circuit test interface 300 includes a test voltage input pad TPADIN, a test voltage output pad TPADOUT, input buffers 311-331, switch units SW1-SW3, TSVs 313-333, and a scan chain 370. Connections need to be described. In the illustrated embodiment, the switch units SW1-SW3 are logic transmission gates composed of P-type and N-type metal-oxide-semiconductor field-effect transistors (MOSFET) that are connected with each other in parallel.

In operation, the switch units SW1-SW3 may be turned on to enable the transmission of a test voltage at a logic high level from the test voltage input pad TPADIN to the input terminals of the input buffers 311-331 through the switch units SW1-SW3. The input buffers 311-331 may generate output voltages according to the logic high level test voltage and transmit the output voltages to the scan chain 370. The scan chain 370 may sequentially transmit the output voltages generated by the input buffers 311-331 to the test voltage output pad TPADOUT, and further according to a clock signal CKSCAN. In one embodiment, if the output voltages generated by the input buffers 311-331 and read by the testing machine through the test voltage output pad TPADOUT are, for example, "1", "1", and "0" respectively (where "1" indicates the logic high level, and "0" indicates the logic low level), it is determined that an error occurs in the input buffer 331.

Figure 4:
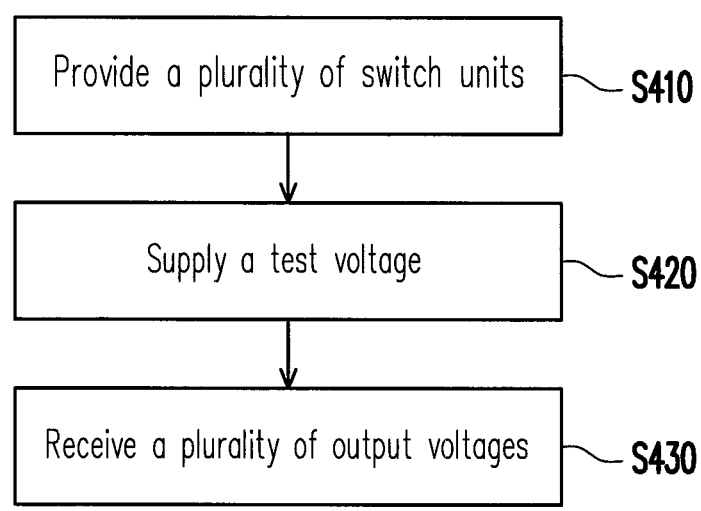
FIG. 4 is a flowchart of a method for testing a circuit according to an embodiment of the present application.

FIG. 4 is a flowchart of a method 400 for testing a circuit according to an embodiment of the application. Referring to FIG. 4, the circuit in the illustrated embodiment includes a plurality of input buffers (e.g. 311-331), wherein an input terminal of each respective input buffer (e.g. 311-331) is respectively coupled to a plurality of TSVs. A test method of the illustrated embodiment includes following steps. In a first method step S410, a plurality of switch units is provided, wherein the switch units are serially connected between a test voltage input pad and the input terminals of the input buffer. In a second method step S420, a test voltage is supplied to the test voltage input pad, and the switch units are turned on so that the test voltage is transmitted to the input buffers. In a last method step S430, a scan chain receives a plurality of output voltages generated by the input buffers in relation to the test voltage, and the output voltages are sequentially transmitted to a test voltage output pad through the scan chain.

Implementation details of the circuit test method in the illustrated embodiment have been described in foregoing embodiments.

As described above, a test voltage input pad may be provided as a means for supplying a test voltage, and once a test operation is started, switch units between the test voltage input pad and the input buffers may be turned on to allow the test voltage to be effectively transmitted to the input buffers. Thus, according to many embodiments, a testing machine need not directly contact the TSVs with a probe. Moreover, in many embodiments of the application, a scan chain may be provided to sequentially transmit output voltages generated by the input buffers to a test voltage output pad, to enable the testing machine to determine whether the input buffers are working properly.

Although this invention has been described in terms of certain preferred embodiments, other embodiments that are apparent to those of ordinary skill in the art, including embodiments that do not provide all of the features and advantages set forth herein, are also within the scope of this invention. Accordingly, the scope of the present invention is defined only by reference to the appended claims and equivalents thereof.

What is claimed is:

1. A circuit test interface, comprising:
a test voltage input pad;
a test voltage output pad;

a plurality of input buffers, each of the plurality of input buffers having a first input terminal, a second input terminal, and an output terminal, and wherein the first input terminal of each respective input buffer is coupled to one of a plurality of through-silicon vias (TSVs);

a plurality of switch units, each of the plurality of switch units having a first terminal and a second terminal, wherein the first terminal of each of the switch units is coupled to the first input terminal of one of the plurality of input buffers and the corresponding TSV, and the second terminal of each of the switch units is coupled to the test voltage input pad; and a scan chain, coupled to both the output terminal of each of the plurality of input buffers and to the test voltage output pad.

2. The circuit test interface according to claim 1, wherein each of the plurality of TSVs and the test voltage input pad have a parasitic capacitance and the parasitic capacitance at each of the plurality of TSVs is smaller than the parasitic capacitance at the test voltage input pad.

3. The circuit test interface according to claim 1, wherein the circuit test interface is configured such that the plurality of switch units are electrically connected to the test voltage input pad and the plurality of input buffers.

4. The circuit test interface according to claim 3, wherein each of the plurality of input buffers is configured to generate output voltages according to a test voltage from the test voltage input pad, and the scan chain is configured to sequentially transmit the output voltages to the test voltage output pad.

5. The circuit test interface according to claim 4, wherein the scan chain is configured to receive a clock signal and sequentially transmit the output voltages from the plurality of input buffers to the test voltage output pad according to the clock signal.

6. The circuit test interface according to claim 4, wherein the test voltage output pad is further connected to a testing machine, and the testing machine is configured to compare the output voltages from the plurality of input buffers with the test voltage from the test voltage input pad to generate a test result.

7. The circuit test interface according to claim 1, wherein the plurality of switch units comprise a plurality of logic transmission gates.

8. The circuit test interface according to claim 1, wherein the plurality of input buffers comprise a plurality of logic gates.

9. A test method of a circuit, wherein the circuit comprises a plurality of input buffers, each of the plurality of input buffers having a first input terminal, a second input terminal, and an output terminal, and the first input terminal of each of the plurality of the input buffers is coupled to one of a plurality of TSVs, the test method comprising:

creating, using a plurality of switch units, an electrical connection between a test voltage input pad and at least one of the plurality of input buffers;

transmitting a test voltage from the test voltage input pad via the plurality of switch units to the plurality of input buffers;

receiving an output voltage from each output terminal of the plurality of input buffers into a scan chain; and transmitting sequentially the output voltages received by the scan chain to a test voltage output pad.

10. The test method according to claim 9, wherein each of the plurality of TSVs and the test voltage input pad have a parasitic capacitance and the parasitic capacitance at each of the plurality of TSVs is smaller than the parasitic capacitance at the test voltage input pad.

11. The test method according to claim 9 further comprising:

probing the test voltage input pad and the test voltage output pad with a testing machine, and comparing the voltages at the test voltage output pad with the test voltage at the test voltage input pad.

12. The test method according to claim 9, wherein the scan chain is configured to sequentially transmit the output voltages from the plurality of input buffers according to a clock signal.

* * * * *